United States Patent
Kajiki

(10) Patent No.: US 8,106,495 B2
(45) Date of Patent: Jan. 31, 2012

(54) SEMICONDUCTOR APPARATUS AND MANUFACTURING METHOD THEREOF

(75) Inventor: Atsunori Kajiki, Nagano (JP)

(73) Assignee: Shinko Electric Industries Co., Ltd., Nagano-shi, Nagano (JP)

(*) Notice: Subject to any disclaimer, the term of this patent is extended or adjusted under 35 U.S.C. 154(b) by 97 days.

(21) Appl. No.: 12/639,421

(22) Filed: Dec. 16, 2009

(65) Prior Publication Data

US 2010/0148332 A1 Jun. 17, 2010

(30) Foreign Application Priority Data

Dec. 17, 2008 (JP) ................................. 2008-321038

(51) Int. Cl.
*H01L 23/02* (2006.01)
*H01L 21/50* (2006.01)

(52) U.S. Cl. ........ 257/678; 257/686; 257/778; 257/780; 257/782; 257/783; 257/E23.178; 257/E23.18; 257/E21.499

(58) Field of Classification Search .............. 257/678, 257/686, 778, 780, 782, 783, E23.18, E23.178, 257/E21.499
See application file for complete search history.

(56) References Cited

U.S. PATENT DOCUMENTS

| | | | |
|---|---|---|---|
| 6,025,648 A * | 2/2000 | Takahashi et al. | 257/778 |
| 6,344,682 B1 * | 2/2002 | Tomita | 257/686 |
| 7,141,873 B2 * | 11/2006 | Aoyagi | 257/686 |
| 7,982,298 B1 * | 7/2011 | Kang et al. | 257/686 |
| 2005/0003587 A1 * | 1/2005 | Shiozawa | 438/126 |
| 2007/0096287 A1 * | 5/2007 | Araki et al. | 257/686 |
| 2007/0096334 A1 * | 5/2007 | Kawabata et al. | 257/777 |
| 2008/0157329 A1 * | 7/2008 | Inoue | 257/686 |

FOREIGN PATENT DOCUMENTS

| | | |
|---|---|---|
| JP | 2003-347722 | 12/2003 |
| JP | 2008-159956 | 7/2008 |
| WO | 2007/069606 | 6/2007 |

* cited by examiner

*Primary Examiner* — Eugene Lee
*Assistant Examiner* — Peniel M Gumedzoe
(74) *Attorney, Agent, or Firm* — Drinker Biddle & Reath LLP

(57) ABSTRACT

A semiconductor apparatus includes a first wiring substrate, a second wiring substrate, a semiconductor chip, an adhesive layer and a molding resin. The second wiring substrate is stacked and connected on the first wiring substrate through a bump electrode. The semiconductor chip is mounted on the first wiring substrate by flip chip bonding and received between the first wiring substrate and the second wiring substrate. An upper surface of the semiconductor chip is subject to a mirror treatment. The adhesive layer is formed on the upper surface of the semiconductor chip. The molding resin is filled in a gap between the first wiring substrate and the second wiring substrate.

4 Claims, 7 Drawing Sheets

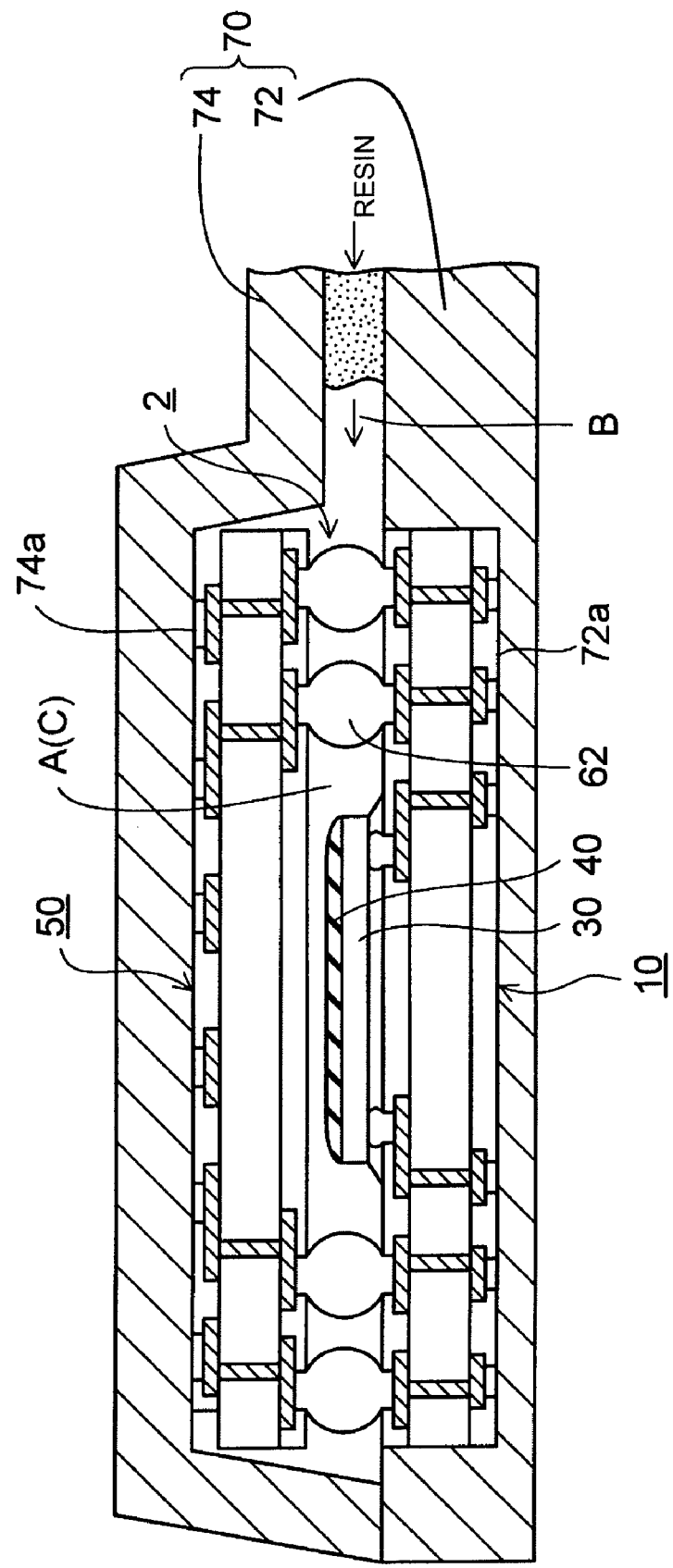

SEMICONDUCTOR APPARATUS AND MANUFACTURING METHOD THEREOF

This application claims priority to Japanese Patent Application No. 2008-321038, filed Dec. 17, 2008, in the Japanese Patent Office. The Japanese Patent Application No. 2008-321038 is incorporated by reference in its entirety.

TECHNICAL FIELD

The present disclosure relates to a semiconductor apparatus and a manufacturing method thereof, and more particularly to a resin-sealed semiconductor apparatus in which a semiconductor chip is received between stacked wiring substrates and a gap between the wiring substrates is filled with a resin, and a manufacturing method of the semiconductor apparatus.

RELATED ART

There are various semiconductor apparatuses. Description in which plural substrates, on each of which an electronic component is mounted, are stacked on a substrate, on which an electronic component is mounted through a solder ball, and a gap between the substrates is sealed with a resin is made in Patent Reference 1.

Also, description in which one wiring substrate is stacked and connected on the other wiring substrate by a solder ball and a first electronic component is mounted on one wiring substrate and a second electronic component is received in an opening part of the other wiring substrate and a gap between a pair of the wiring substrates is sealed with a resin is made in Patent Reference 2.

Also, description in which a second substrate is stacked and connected on a first substrate on which a semiconductor chip is mounted through a solder ball and a gap between the first and second substrates is filled with a molding resin is made in Patent Reference 3.

[Patent Reference 1] JP-A-2003-347722
[Patent Reference 2] JP-A-2008-159956
[Patent Reference 3] WO 2007/069606 A1

As described in a column of a related art described below, there is a resin-sealed semiconductor apparatus constructed by stacking and connecting a second wiring substrate on a first wiring substrate on which a semiconductor chip is mounted by flip chip bonding through a bump electrode and filling a gap between the wiring substrates with a molding resin.

In such a semiconductor apparatus, the semiconductor chip is thinned to 100 µm or less by grinding in order to achieve thinning of the whole apparatus. As a result of this, a minute crack often occurs in a grinding surface (upper surface) of the semiconductor chip and in order to remove the crack, polishing processing is performed on the grinding surface of the semiconductor chip. For example, a buffing (that is a polishing using a polishing cloth, which is provided with diamond or polishing paste such as aluminum oxide and the like, or which is soaked into slurry) is performed as the polishing processing.

Since the molding resin is formed on a mirror surface of the semiconductor chip, it is difficult to obtain high adhesion properties by an anchor effect and there is a problem of forming the molding resin in a state of low adhesion properties with respect to the semiconductor chip. As a result of that, when moisture absorbed by the semiconductor apparatus vaporizes and volume expansion is caused, peeling occurs at an interface between the molding resin and the semiconductor chip with low adhesion properties and thus, there is fear of leading to destruction of the semiconductor apparatus.

SUMMARY

Exemplary embodiments of the present invention provide a semiconductor apparatus capable of obtaining sufficient reliability by improving adhesion properties in a semiconductor apparatus of a structure in which a thinned semiconductor chip is mounted between wiring substrates and is sealed with a resin, and a manufacturing method of the semiconductor apparatus.

A semiconductor apparatus according to the exemplary embodiment of the present invention, comprises:

a first wiring substrate;

a second wiring substrate which is stacked and connected on the first wiring substrate through a bump electrode;

a semiconductor chip which is mounted on the first wiring substrate by flip chip bonding and received between the first wiring substrate and the second wiring substrate, an upper surface of the semiconductor chip being subject to a mirror treatment;

an adhesive layer which is formed on the upper surface of the semiconductor chip; and a molding resin which is filled in a gap between the first wiring substrate and the second wiring substrate.

In the case of manufacturing a semiconductor apparatus of the invention, a semiconductor chip, an upper surface of which is subject to the mirror treatment, is first mounted on a first wiring substrate by flip chip bonding. The semiconductor chip is obtained by dicing a silicon wafer after a back surface of the silicon wafer in which an element forming region is disposed in the front surface side is ground to make the silicon wafer thin and mirror treatment is performed. The mirror treatment is performed in order to remove a minute crack occurring by grinding. In this manner, the semiconductor chip, the upper surface of which is subject to mirror treatment, is obtained.

In the semiconductor chip in which mirror treatment is performed, an anchor effect becomes resistant to working, so that adhesion properties of a layer (a molding resin etc.) formed on the semiconductor chip become worse. Because of this, an adhesive layer is formed on the upper surface (mirror surface) of the semiconductor chip in the invention. As the adhesive layer, a coupling material or a resin without including a mold release material is suitably used.

Then, a second wiring substrate is stacked on the first wiring substrate through a bump electrode and the semiconductor chip is received in a receiving part between the first wiring substrate and the second wiring substrate. At this time, it may be constructed so that a gap occurs between the adhesive layer on the semiconductor chip and a lower surface of the second wiring substrate or the adhesive layer on the semiconductor chip makes contact with the lower surface of the second wiring substrate.

Further, a gap between the first wiring substrate and the second wiring substrate is filled with a molding resin and the semiconductor chip is sealed with the resin. When a gap is disposed between the adhesive layer on the semiconductor chip and the lower surface of the second wiring substrate in the case of stacking the second wiring substrate, it is sealed with the resin so that the molding resin is interposed between the adhesive layer and the second wiring substrate.

In the semiconductor apparatus of the invention, the adhesive layer is disposed on the semiconductor chip, so that even when the upper surface of the semiconductor chip is a mirror surface without having the anchor effect, the molding resin formed on its surface is formed with sufficient adhesion properties. Or, when the adhesive layer on the semiconductor chip makes contact with the second wiring substrate, the second wiring substrate is arranged with sufficient adhesion properties by the adhesive layer on the semiconductor chip.

Therefore, even when moisture absorbed by the semiconductor apparatus vaporizes and volume expansion is caused, an interface of the upper surface side of the semiconductor chip has sufficient adhesion properties, so that peeling is prevented from occurring at their interfaces. Consequently, reliability of the semiconductor apparatus can be improved.

As mentioned above, in the present invention, it is possible to obtain sufficient reliability by improving adhesion properties in a semiconductor apparatus of a structure in which a thinned semiconductor chip is mounted between wiring substrates and is sealed with a resin.

Other features and advantages may be apparent from the following detailed description, the accompanying drawings and the claims.

BRIEF DESCRIPTION OF THE DRAWINGS

FIGS. 2A to 5 are sectional views showing a manufacturing method of a semiconductor apparatus of a first embodiment of the invention.

DETAILED DESCRIPTION

Embodiments of the invention will hereinafter be described with reference to the accompanying drawings.

Related Art

Figure 1A:
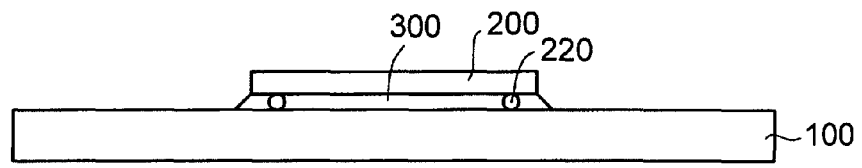
FIGS. 1A to 1C are sectional views showing a manufacturing method of a semiconductor apparatus of the related art.
Figure 1B:
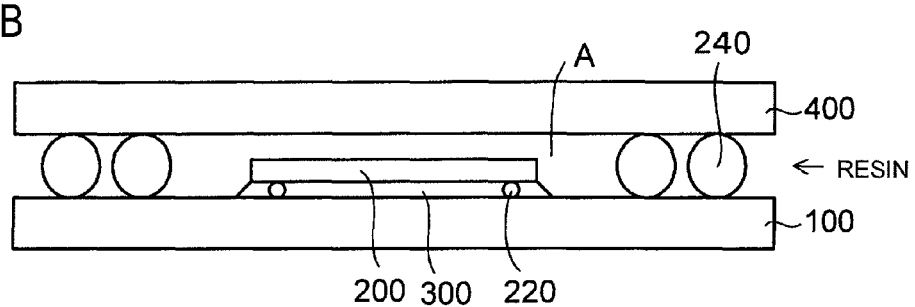
Figure 1C:
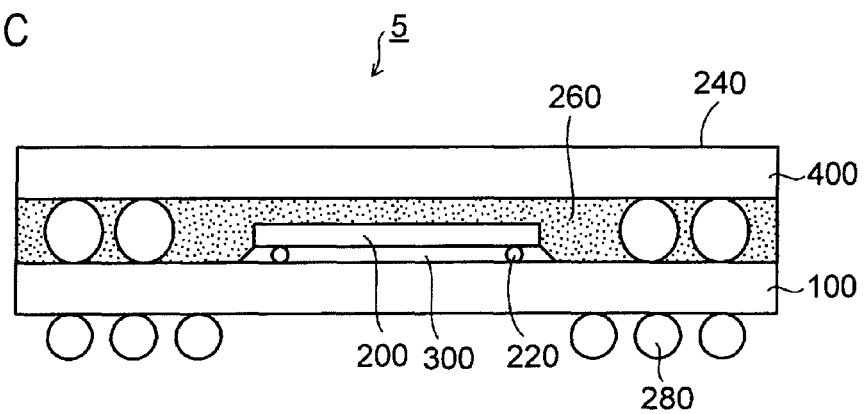

A problematical point of a related art related to the invention will be described before the embodiments of the invention are described. FIGS. 1A to 1C are sectional views showing a manufacturing method of a semiconductor apparatus of the related art.

As shown in FIG. 1A, flip chip bonding between a wiring layer (not shown) of a first wiring substrate 100 and a connection electrode 220 of a semiconductor chip 200 is first made. The semiconductor chip 200 is thinned to a thickness of 100 μm or less and polishing processing of its upper surface is performed.

Thereafter, a gap between the lower side of the semiconductor chip 200 and an upper surface of the first wiring substrate 100 is filled with an under fill resin 300. Then, as shown in FIG. 1B, a second wiring substrate 400 is stacked and connected on the first wiring substrate 100 through bump electrodes 240 arranged so as to surround a receiving part A of the semiconductor chip 200. A height of the bump electrode 240 is set higher than a height of the semiconductor chip 200 and the semiconductor chip 200 is received in the receiving part A between the first wiring substrate 100 and the second wiring substrate 400.

Then, a gap between the first and the second wiring substrates 100 and 400 is filled with a resin by a transfer molding construction method using a molding mold. Consequently, as shown in FIG. 1C, the semiconductor chip 200 received between the first and the second wiring substrates 100 and 400 is sealed with a molding resin 260.

Thereafter, external connection terminals 280 are disposed by installing solder balls etc. in a wiring layer (not shown) of the lower surface side of the first wiring substrate 100. Consequently, a resin-sealed semiconductor apparatus 5 of the related art is obtained.

In the resin-sealed semiconductor apparatus 5, thinning of the whole apparatus is desired, so that it is necessary to set the semiconductor chip 200 as thin as possible. The semiconductor chip 200 is obtained by dicing a silicon wafer after a back surface of the silicon wafer in which an element forming region is disposed in the front surface side is ground by a grinder to make the silicon wafer thin to a necessary thickness.

At this time, a minute crack often occurs in a grinding surface of the semiconductor chip 200 and as the semiconductor chip 200 is thinned, the crack advances in a mounting step etc. and the semiconductor chip 200 may be destroyed.

As this countermeasure, polishing processing is performed by wet polishing etc. after the back surface of the silicon wafer is ground. Consequently, the semiconductor chip 200, the upper surface of which is subject to polishing processing as described above, is obtained.

In the semiconductor apparatus 5 (FIG. 1C) of the related art, the upper surface of the semiconductor chip 200 becomes a mirror surface and smoothness is high, so that sufficient adhesion properties of the molding resin 260 by an anchor effect are not obtained and there is a problem of low adhesion properties between the semiconductor chip 200 and the molding resin 260. As the upper surface of the semiconductor chip 200 is smooth, a contact area of the molding resin 260 per unit area becomes small, so that the anchor effect becomes weak.

Also, this results from the fact that the molding resin 260 has lower adhesion properties to the semiconductor chip 200 (silicon) than other resins such as the under fill resin 300 since the molding resin 260 includes a mold release material (wax) in order to be easily detached from the molding mold.

When the semiconductor apparatus 5 absorbs moisture, moisture tends to gather at an interface with which a material with low adhesion properties makes contact. Then, the moisture evaporates (vaporizes) by heating treatment such as a step of making connection to a mounting substrate by reflow heating of the external connection terminals 280 and thereby, volume expansion is caused and force of pushing up a film is applied. At this time, it is in a state of low adhesion properties between the semiconductor chip 200 and the molding resin 260, so that peeling occurs at its interface and thus, the semiconductor apparatus 5 may be destroyed.

When the semiconductor chip 200 is sealed with the molding resin 260 in a state of exposing the upper surface of the semiconductor chip 200 (in the absence of the second wiring substrate 400), a method for improving adhesion properties of the molding resin 260 by ashing treatment of the upper surface of the semiconductor chip 200 can be adopted.

However, in the related art, the second wiring substrate 400 is present on the semiconductor chip 200, so that the ashing treatment cannot be performed sufficiently with respect to the upper surface of the semiconductor chip 200 and it is difficult to adopt a technique for improving adhesion properties by the ashing treatment.

A manufacturing method of a semiconductor apparatus of the present embodiment described below can solve the trouble described above.

First Embodiment

FIGS. 2 to 5 are sectional views showing a manufacturing method of a semiconductor apparatus of a first embodiment of the invention. In the manufacturing method of the semiconductor apparatus of the first embodiment, a first wiring substrate 10 as shown in FIG. 2A is first prepared. In the first wiring substrate 10, a through hole TH is disposed in a core substrate 12 made of an insulating material such as a glass epoxy resin. Wiring layers 20 mutually connected through a through electrode 14 with which the inside of the through hole TH is filled are respectively formed on the sides of both surfaces of the core substrate 12.

Or, the wiring layers 20 may be mutually connected through a through hole plated layer (through electrode) disposed on an inner wall of the through hole TH of the core substrate 12 and a hole of the through hole TH may be filled with a resin.

Further, solder resists 16 in which opening parts 16a are disposed on connection parts of the wiring layers 20 are respectively formed on the sides of both surfaces of the core substrate 12. A contact part (not shown) is disposed by, for example, forming a Ni/Au plated layer in the connection part of the wiring layer 20.

Figure 2A:
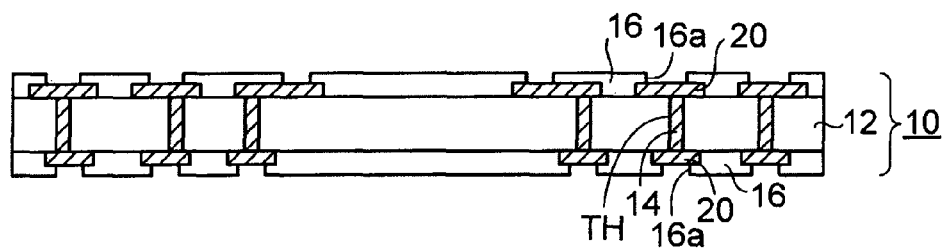

In an example of FIG. 2A, the wiring layers 20 of one layer are respectively formed on both surfaces of the core substrate 12, but the number of stacks of the wiring layer formed on the core substrate 12 can be set arbitrarily. Also, a coreless wiring substrate without having the core substrate 12 may be used.

Figure 2B:
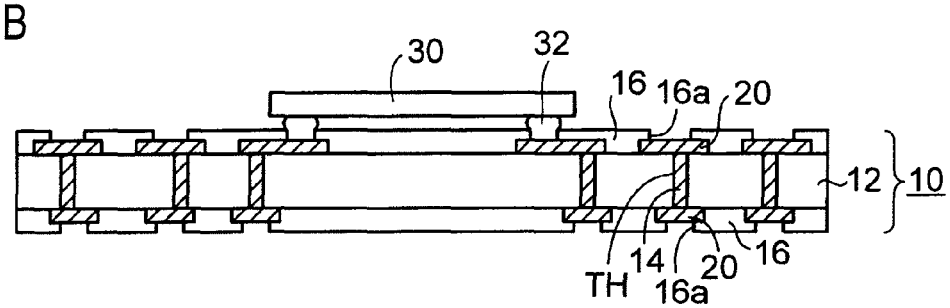
Figure 2C:
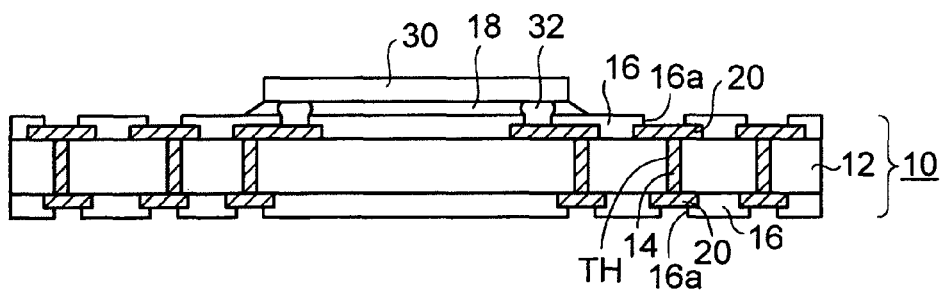

Then, as shown in FIG. 2B, flip chip bonding between a connection electrode 32 of a semiconductor chip 30 (LSI chip) and the connection part of the wiring layer 20 of the upper surface side of the first wiring substrate 10 is made. Further, as shown in FIG. 2C, a gap between the semiconductor chip 30 and the first wiring substrate 10 is filled with an under fill resin 18.

As described in the related art mentioned above, the semiconductor chip 30 is obtained by dicing a silicon wafer after a back surface of the silicon wafer in which an element forming region is disposed in the front surface side is ground by a grinder to make the silicon wafer thin to a necessary thickness.

After the silicon wafer is thinned to a thickness of 100 μm or less (for example, 50 to 60 μm), polishing processing of its grinding surface is performed by wet polishing etc. An upper surface of the semiconductor chip 30 of FIG. 2B corresponds to the grinding surface side of the back surface of the silicon wafer.

The reason why the upper surface of the semiconductor chip 30 becomes a mirror surface is because a minute crack often occurs in the grinding surface (upper surface) of the thinned semiconductor chip 30 and, for example, when the semiconductor chip 30 is mounted, the crack advances and destruction may be caused as described in the related art. Because of that, in the semiconductor chip 30, polishing processing of the grinding surface (upper surface) is performed and the minute crack is removed.

Surface roughness (Ra) of the grinding surface (upper surface) of the semiconductor chip 30 obtained based on grinding of the silicon wafer by the grinder is about 0.1 mm (100 μm). On the other hand, surface roughness (Ra) of the mirror surface (upper surface) of the semiconductor chip 30 obtained based on polishing processing of its grinding surface after the silicon wafer is ground by the grinder becomes 8 to 12 μm (about 10 μm).

Thus, a difference between the surface roughnesses (Ra) of the mirror surface on which polishing processing is performed and the grinding surface by the grinder is about 10 times and it is understood that the surface is remarkably smoothed by performing the polishing processing.

In the embodiment, polishing processing of the upper surface of the semiconductor chip 30 is performed and the surface roughness (Ra) becomes small, so that an anchor effect becomes resistant to working in the case of sealing the semiconductor chip 30 with a molding resin and adhesion force of the molding resin reduces.

Figure 3A:
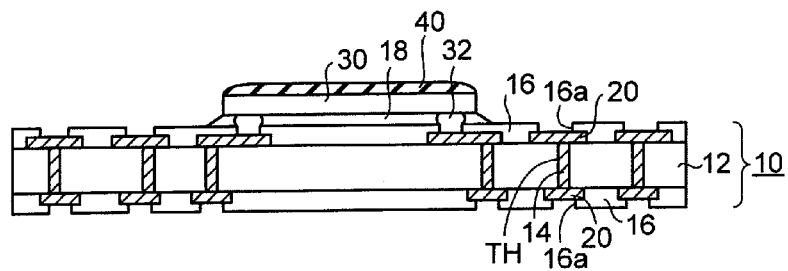

Hence, in the embodiment, an adhesive layer 40 is formed on the upper surface of the semiconductor chip 30 as shown in FIG. 3A. As a suitable material of the adhesive layer 40, there is the same resin as the under fill resin used in a step of FIG. 2C.

Unlike a molding resin described below, a mold release material (wax) is not included in the under fill resin, so that sufficient adhesion properties to the semiconductor chip 30 (silicon) are obtained. Such a resin without including the mold release material (wax) is applied to the upper surface of the semiconductor chip 30 and heating treatment is performed in an atmosphere of temperature of 150 to 200° C. and the resin is cured and thereby, the adhesive layer 40 is obtained.

Also, the resin without including the mold release material used as the adhesive layer 40 has good adhesion properties to the semiconductor chip (silicon) from the standpoint of having a lower content rate of a filler than the molding resin described below. For example, 20 to 40% (for example, 30%) fillers with a diameter of about 5 μm are contained in resin without including the mold release material used as the adhesive layer 40. In addition, in the embodiment, it is not always necessary to use a resin containing a filler as the adhesive layer 40.

Also, as a suitable material of the adhesive layer 40, there is a coupling material. Since a silane coupling material etc. have an organic functional group and a hydrolyzable group in one molecule, an inorganic substance (the semiconductor chip 30) can be coupled to an organic substance (the molding resin described below) and adhesion properties between their substances can be improved.

The silane coupling material etc. are applied to the upper surface of the semiconductor chip 30 and heating treatment is performed for 0.5 hour in an atmosphere of temperature of 80° C. and thereafter, heating treatment is performed for 2 hours in an atmosphere of temperature of 200° C. and the silane coupling material etc. are cured and thereby, the adhesive layer 40 is obtained.

In addition, the adhesive layer 40 may be obtained by applying a resin without including a mold release material after surface treatment of the upper surface of the semiconductor chip 30 is performed by a coupling material.

The coupling material and the resin without including the mold release material are given as the adhesive layer 40, but various adhesive (gluing) materials capable of adhesion between the semiconductor chip 30 and the molding resin can be used as long as a material without losing reliability of the semiconductor apparatus finally obtained is used.

Figure 3B:
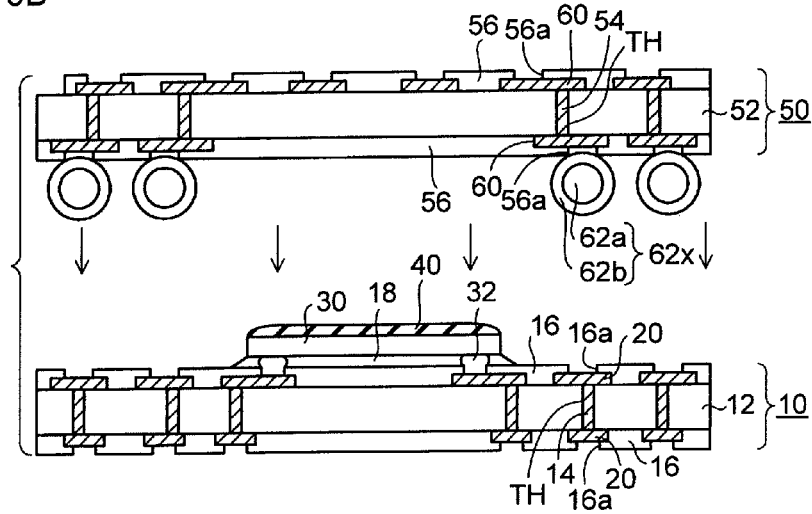

Then, a second wiring substrate 50 as shown in FIG. 3B is prepared. The second wiring substrate 50 has a structure similar to that of the first wiring substrate 10. That is, a through hole TH is disposed in a core substrate 52 and the inside of the through hole TH is filled with a through electrode 54. Wiring layers 60 mutually connected through the through electrode 54 are respectively formed on the sides of both surfaces of the core substrate 52. Further, solder resists 56 in which opening parts 56a are disposed on connection parts of the wiring layers 60 are respectively formed on the sides of both surfaces of the core substrate 52.

Also in the second wiring substrate 50, various wiring substrates such as a coreless wiring substrate can be used while the number of stacks of the wiring layer can be set arbitrarily like the first wiring substrate 10.

Further, a conductive ball 62x is installed on the connection part of the wiring layer 60 of the lower surface peripheral edge side of the second wiring substrate 50. The conductive ball 62x is constructed by covering an outer surface of a copper ball 62a with a solder layer 62b. Since the semiconductor chip 30 is received in a receiving part constructed of the first wiring substrate 10 and the second wiring substrate 50, a height (diameter) of the conductive ball 62x is set higher than a height (the total thickness of the semiconductor chip 30 and the connection electrode 32) of the semiconductor chip 30.

Then, the conductive ball 62x of the lower surface side of the second wiring substrate 50 is arranged on the connection part of the wiring layer 20 of the peripheral edge side of the first wiring substrate 10. Further, the conductive ball 62x is bonded to the wiring layers 20, 60 of the first and second wiring substrates 10, 50 by melting the solder layer 62b by reflow heating. Or, the conductive ball 62x may be installed on the side of the first wiring substrate 10 and the second wiring substrate 50 may be arranged on the conductive ball 62x.

Figure 3C:
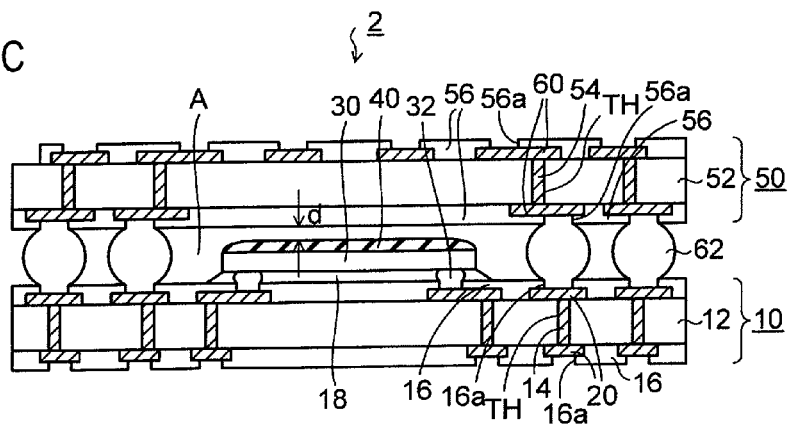

Consequently, the wiring layer 20 of the first wiring substrate 10 is electrically connected to the wiring layer 60 of the second wiring substrate 50 by a bump electrode 62 as shown in FIG. 3C. At the same time, the semiconductor chip 30 is received in a receiving part A surrounded by the bump electrodes 62 between the first wiring substrate 10 and the second wiring substrate 50. The first embodiment is in a state of disposing a gap d between an upper surface of the adhesive layer 40 on the semiconductor chip 30 and a lower surface of the second wiring substrate 50.

In this manner, a stacked wiring member 2 constructed by stacking the second wiring substrate 50 on the first wiring substrate 10 on which the semiconductor chip 30 is mounted by flip chip bonding is obtained.

Then, a molding mold 70 basically constructed by a lower mold 72 and an upper mold 74 is prepared as shown in FIG. 4. The molding mold 70 is a metal mold for being filled with a molding resin by a transfer molding construction method. A recessed part 72a corresponding to the first wiring substrate 10 of the stacked wiring member 2 is disposed in the upper surface side of the lower mold 72. Also, a recessed part 74a corresponding to the second wiring substrate 50 of the stacked wiring member 2 is disposed in the lower surface side of the upper mold 74.

Then, the stacked wiring member 2 is arranged in the recessed part 72a of the lower mold 72 and the upper mold 74 is arranged on the lower mold 72 so as to receive the second wiring substrate 50 of the stacked wiring member 2 in the recessed part 74a of the upper mold 74.

By pinching the stacked wiring member 2 by the lower mold 72 and the upper mold 74 in this manner, the receiving part A between the first wiring substrate 10 and the second wiring substrate 50 becomes a cavity C filled with a resin. Also, a gap is disposed between the lower mold 72 and the upper mold 74 in the outside of one end of the stacked wiring member 2 and the gap forms a resin supply part B (a molding gate) connected to the cavity C. It is constructed so that a melted resin passes through the resin supply part B and flows into the cavity C.

By the transfer molding construction method using such a molding mold 70, the melted resin is allowed to flow into the side of the cavity C through the resin supply part B. After the whole cavity C is filled with the resin, the upper mold 74 and the lower mold 72 are detached from the stacked wiring member 2 and a gate resin part formed in the resin supply part B is broken off and thereby, the gate resin part is separated from the resin with which the inside of the cavity C is filled.

Figure 5:
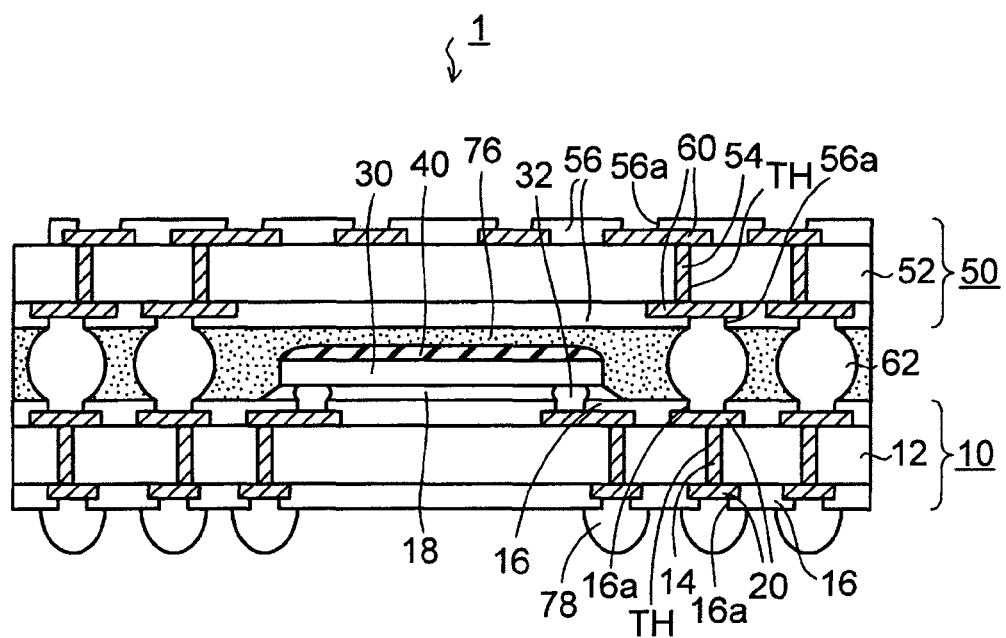

Consequently, a gap between the first wiring substrate 10 and the second wiring substrate 50 is filled with a molding resin 76 and the semiconductor chip 30 is sealed with the resin as shown in FIG. 5. A mold release material (wax) is included in the molding resin 76 used by the transfer molding construction method in order to be easily detached from the molding mold 70. Therefore, when the molding resin 76 is directly formed on the mirror surface in the case of performing polishing processing of the upper surface of the semiconductor chip 30, adhesion properties are low and peeling at its interface tends to occur.

As the mold release material (wax), there is a natural material or a chemical synthetic material. As the natural material, for example, there is carnauba wax obtained by using wax present on a surface of a leaf of a palm plant as a raw material.

Also, 65 to 85% (for example, 75%) fillers with a diameter of about 30 μm are contained in the molding resin 76 and adhesion properties to the semiconductor chip 30 tend to be low from the standpoint of a small resin component.

However, in the embodiment, the adhesive layer 40 is disposed on the upper surface of the semiconductor chip 30, so that the molding resin 76 is formed on the adhesive layer 40 with sufficient adhesion properties. As a result of that, the molding resin 76 is formed with sufficient adhesion properties to the semiconductor chip 30 by a function of the adhesive layer 40.

Thereafter, external connection terminals 78 are disposed by, for example, installing solder balls in the connection parts of the wiring layer 20 of the lower surface side of the first wiring substrate 10.

By the above, a resin-sealed semiconductor apparatus 1 of the first embodiment is obtained as shown in FIG. 5.

As shown in FIG. 5, the connection electrode 32 of the semiconductor chip 30 is mounted on the wiring layer 20 of the upper surface side of the first wiring substrate 10 described in FIG. 2A by flip chip bonding in the semiconductor apparatus 1 of the first embodiment. A gap between the lower portion of the semiconductor chip 30 and the upper surface of the first wiring substrate 10 is filled with the under fill resin 18. Polishing processing of the upper surface of the semiconductor chip 30 is performed and surface roughness (Ra) of its mirror surface becomes about 10 μm and the surface is smoothed.

The adhesive layer 40 is formed on the upper surface (mirror surface) of the semiconductor chip 30. As the adhesive layer 40, for example, a coupling material or a resin without including a mold release material is used.

The second wiring substrate 50 described in FIG. 3B is stacked and arranged on the first wiring substrate 10 through the bump electrode 62. The wiring layer 20 of the first wiring substrate 10 is electrically connected to the wiring layer 60 of the second wiring substrate 50 through the bump electrode 62.

A height of the bump electrode 62 is set higher than a height of the semiconductor chip 30, and the semiconductor chip 30 is received between the first and second wiring substrates 10, 50. A gap between the first and second wiring substrates 10, 50 is filled with the molding resin 76 and the semiconductor chip 30 is sealed with the molding resin 76.

Thus, the adhesive layer 40 is formed on the upper surface (mirror surface) of the semiconductor chip 30 and the top of the adhesive layer 40 is filled with the molding resin 76. That is, the molding resin 76 is interposed between an upper surface of the adhesive layer 40 on the semiconductor chip 30 and a lower surface of the second wiring substrate 50.

Consequently, the molding resin 76 is formed with sufficient adhesion properties to the semiconductor chip 30 through the adhesive layer 40.

Therefore, even when the semiconductor apparatus 1 absorbs moisture and the moisture gathered at an interface between different materials evaporates (vaporizes) by heating treatment and thereby volume expansion is caused, the semiconductor chip 30, the adhesive layer 40 and the molding resin 76 adhere mutually by high adhesion force, so that peeling is prevented from occurring at their interfaces.

As a result of that, reliability in the case of actually using the semiconductor apparatus 1 can be improved while a yield can be improved in moisture absorption and heating tests of the semiconductor apparatus 1.

Second Embodiment

Figure 6A:
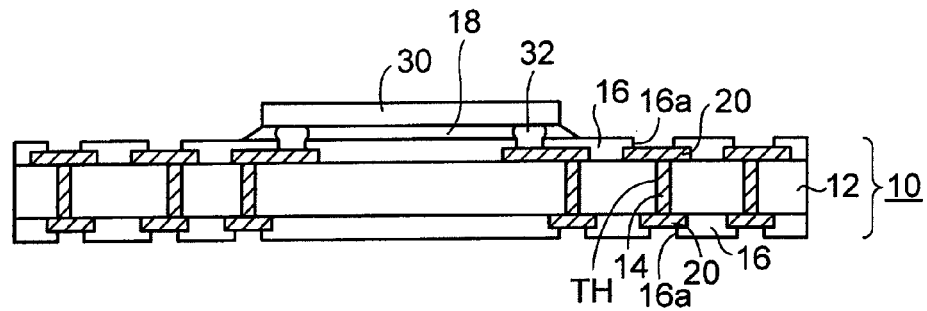
FIGS. 6A to 7B are sectional views showing a manufacturing method of a semiconductor apparatus of a second embodiment of the invention.

FIGS. 6 and 7 are sectional views showing a manufacturing method of a semiconductor apparatus of a second embodiment of the invention.

The second embodiment is characterized in that a semiconductor chip is made to adhere to a second wiring substrate directly by an adhesive layer without interposing a molding resin between an upper surface (mirror surface) of the semiconductor chip and a lower surface of the second wiring substrate.

In the second embodiment, the detailed description is omitted by assigning the same numerals to the same elements and the same steps as those of the first embodiment.

In the manufacturing method of the semiconductor apparatus of the second embodiment, the same structural body as that of FIG. 2C of the first embodiment described above is prepared as shown in FIG. 6A. That is, after a semiconductor chip 30 is mounted in a first wiring substrate 10 by flip chip bonding, a gap between a lower portion of the semiconductor chip 30 and an upper surface of the first wiring substrate 10 is filled with an under fill resin 18.

Figure 6B:
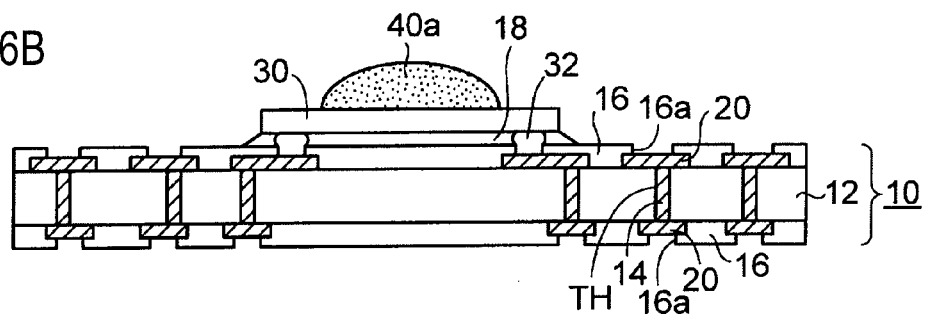

Then, an adhesive material 40a is applied to an upper surface (mirror surface) of the semiconductor chip 30 as shown in FIG. 6B. As the adhesive material 40a, the resin without including the mold release material (wax) described in the first embodiment is suitably used.

Figure 6C:
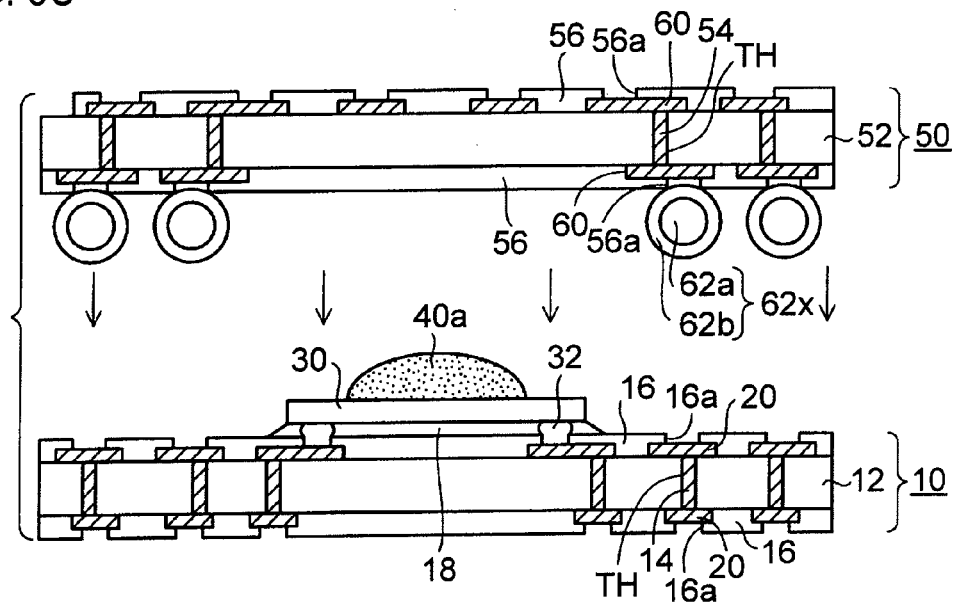

Subsequently, as shown in FIG. 6C, a second wiring substrate 50 in which conductive balls 62x are installed on the lower surface side is stacked and connected on the first wiring substrate 10 like the step of FIG. 3B of the first embodiment. In the second embodiment, the application amount (volume) of the adhesive material 40a or a diameter of the conductive ball 62x installed on the second wiring substrate 50 is adjusted so that a gap does not occur by making contact between the adhesive material 40a on the semiconductor chip 30 and a lower surface of the second wiring substrate 50.

Or, the adhesive material 40a may be formed using a coupling material as a main material. In this case, for example, an adhesive in which the coupling material is included is used and its application amount (volume) or a diameter of the conductive ball 62x installed on the second wiring substrate 50 is adjusted.

Figure 7A:
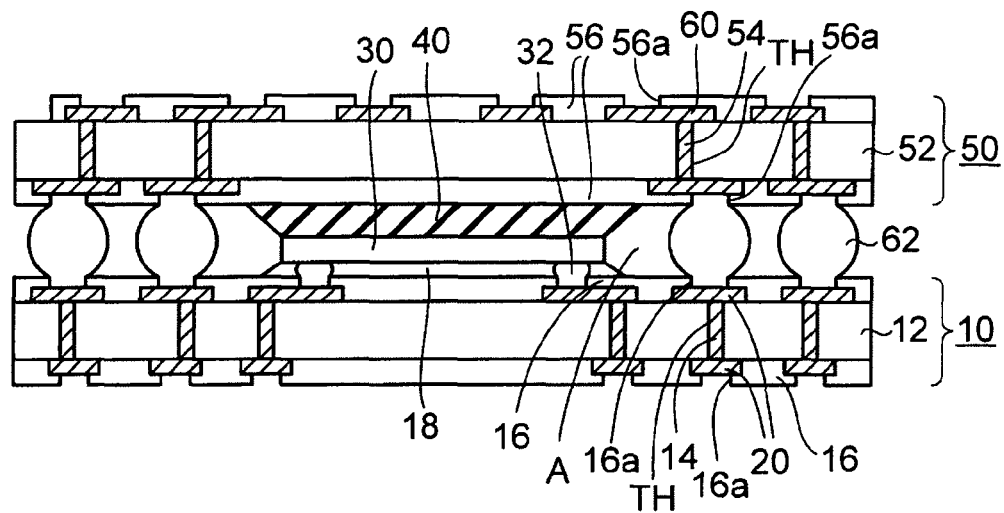

Consequently, as shown in FIGS. 6(c) and 7(a), the uncured adhesive material 40a on the semiconductor chip 30 is pushed in a lateral direction by the second wiring substrate 50 and flows and a gap between the upper surface (mirror surface) of the semiconductor chip 30 and the lower surface of the second wiring substrate 50 is filled with the adhesive material 40a.

Further, an adhesive layer 40 is obtained by heat-treating and curing the adhesive material 40a. Also at the same time, a wiring layer 20 of the first wiring substrate 10 is electrically connected to a wiring layer 60 of the second wiring substrate 50 through a bump electrode 62.

In the second embodiment, a gap is not disposed between the second wiring substrate 50 and the adhesive layer 40 on the semiconductor chip 30, and the semiconductor chip 30 is received in a receiving part A between the first and second wiring substrates 10, 50 in a state of filling a gap between the second wiring substrate 50 and an upper surface of the semiconductor chip 30 with the adhesive layer 40.

Figure 7B:
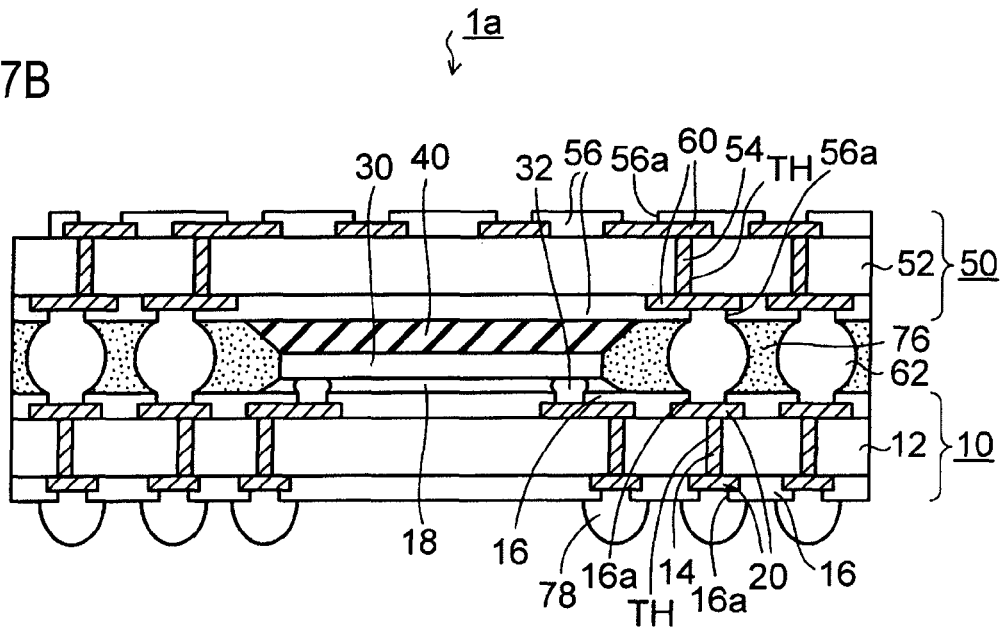

Further, as shown in FIG. 7B, the receiving part A (cavity) between the first and second wiring substrates 10, 50 is filled with a molding resin 76 by a transfer molding construction method similar to that of the first embodiment. The receiving part is filled with the molding resin 76 so as to surround the semiconductor chip 30 and the adhesive layer 40.

Consequently, a semiconductor apparatus 1a of the second embodiment is obtained. The second embodiment has an effect similar to that of the first embodiment.

In the first embodiment described above, a gap between the adhesive layer 40 on the semiconductor chip 30 and the solder resist 56 of the lower surface of the second wiring substrate 50 is filled with the molding resin 76. In the first embodiment, adhesion properties between the semiconductor chip 30 and the molding resin 76 are improved by the adhesive layer 40, but the case where adhesion properties between the molding resin 76 and the solder resist 56 of the second wiring substrate 50 are not always obtained sufficiently depending on their materials is assumed.

In the second embodiment, filling with the adhesive layer 40 is performed without interposing the molding resin 76 between the upper surface (mirror surface) of the semiconductor chip 30 and the lower surface side of the second wiring substrate 50.

Therefore, even when adhesion properties between the molding resin 76 and the solder resist 56 of the second wiring substrate 50 are not obtained sufficiently, the solder resist 56 is arranged with sufficient adhesion properties to the semiconductor chip 30 by the adhesive layer 40 and a strength of adhesion between first and second wiring substrates 10, 50 can be reinforced.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:
1. A semiconductor apparatus comprising:
a first wiring substrate;
a second wiring substrate which is stacked and directly connected to on the first wiring substrate through a bump electrode;
a semiconductor chip which is mounted on the first wiring substrate by flip chip bonding and received between the first wiring substrate and the second wiring substrate, an upper surface of the semiconductor chip being formed as a mirror surface;
an adhesive layer which is formed on the upper surface of the semiconductor chip; and
a molding resin which is filled in a gap between the first wiring substrate and the second wiring substrate,
wherein the molding resin is interposed between an upper surface of the adhesive layer on the semiconductor chip and a lower surface of the second wiring substrate, and the molding resin is directly adhered to the upper surface of the adhesive layer.

2. A semiconductor apparatus as claimed in claim 1, wherein the adhesive layer is formed of a coupling material or a resin without including a mold release material and the molding resin includes a mold release material.

3. A semiconductor apparatus as claimed in claim 1, further comprising:

an under fill resin which fills in a gap between a lower side of the semiconductor chip and an upper surface of the first wiring substrate, wherein the adhesive layer is made of the same resin as the under fill resin.

4. A semiconductor apparatus as claimed in claim 1, wherein the mirror surface has a surface roughness Ra, wherein $8 \ \mu m \leqq Ra \leqq 12 \ \mu m$.

* * * * *